United States Patent [19]

Jensen

[11] 4,318,954
[45] Mar. 9, 1982

[54] PRINTED WIRING BOARD SUBSTRATES FOR CERAMIC CHIP CARRIERS

[75] Inventor: Warren M. Jensen, Kirkland, Wash.

[73] Assignee: Boeing Aerospace Company, Seattle, Wash.

[21] Appl. No.: 232,426

[22] Filed: Feb. 9, 1981

[51] Int. Cl.³ .................... B32B 3/00; B32B 9/00; B05D 5/12
[52] U.S. Cl. .................... 428/209; 174/68.5; 427/96; 427/97; 428/212; 428/241; 428/408; 428/901
[58] Field of Search ............... 428/209, 901, 241, 268, 428/408, 902, 212; 427/96, 97; 174/68.5

[56] References Cited

U.S. PATENT DOCUMENTS

| | | | |
|---|---|---|---|
| 3,700,538 | 10/1972 | Kennedy | 428/241 |
| 4,103,102 | 7/1978 | Klein | 428/268 X |
| 4,249,302 | 2/1981 | Crepeau | 428/901 X |
| 4,279,783 | 7/1981 | Kehrer et al. | 428/408 X |
| 4,284,664 | 8/1981 | Rauch | 428/408 X |

Primary Examiner—Thomas J. Herbert, Jr.
Attorney, Agent, or Firm—Thomas H. Murray; Harry B. Keck

[57] ABSTRACT

A composite printed wiring board is provided wherein the surface of the board is fabricated from conventional fiber reinforced plastic laminates such as glass fiber reinforced epoxy laminates and that laminate is secured by means of a thermoset adhesive to a support member which is fabricated from graphite filament reinforced thermoset resin having a low coefficient of thermal expansion approaching zero. The unrestrained coefficient of thermal expansion of the printed wiring board is significantly greater than that of the support member. However, in the composite assembly, the apparent coefficient of thermal expansion of the printed wiring board is greatly reduced and can approximate the coefficient of thermal expansion of a ceramic chip carrier. The coefficient of thermal expansion of the printed wiring board in its thickness direction is only slightly reduced in the composite assembly.

3 Claims, 4 Drawing Figures

PRINTED WIRING BOARD SUBSTRATES FOR CERAMIC CHIP CARRIERS

BACKGROUND OF THE INVENTION

1. Field of the Invention

This invention relates to printed wiring board substrates having extremely low thermal expansion coefficients. The printed wiring board substrates are particularly useful for mounting and interconnecting ceramic chip carriers.

2. Description of the Prior Art

Printed wiring boards are well known in the electronics industry including flexible printed wiring boards (U.S. Pat. No. 4,103,102) and rigid printed wiring boards. Essentially the substrate is a pressed laminate of fibrous reinforcing materials and thermosetting resins. The fibrous reinforcing materials normally are glass fibers, although other fibrous materials have been employed such as nylon, polyethylene terephthalate, aramid and the like. Thermosetting resins normally are polyepoxide resins selected for their thermal resistance although unsaturated polyester resins, polyimides and other thermoset resins have been employed. The printed wiring board is completed by application of electrical conductive material in appropriate patterns for receiving electrical components and electrical connectors. The use of electrical conductor patterns on both surfaces of the printed wiring board is commonplace.

The thermal expansion and contraction of the printed wiring board has been a matter of concern in order to achieve long-term reliability of the printed wiring board and its related components. In some installations it is important to maintain a relationship between the coefficient of thermal expansion of the printed wiring board and the coefficient of thermal expansion of the solder, plating and component leads which are mounted on the board (U.S. Pat. No. 3,700,538).

The coefficient of thermal expansion of the conventional glass fiber reinforced epoxy printed wiring boards is approximately 7.5 microinches/inch/°F. This value is considered acceptable for attachment of axial leads, radial leaded, DIPS and flatpack components onto a printed wiring board.

A particular problem has occurred in attempts to secure leadless ceramic carriers for integrated circuit chips to printed wiring boards, called motherboards. Ceramic chip carriers have thermal expansion coefficients of 3.5 to 4 microinch/inch/°F. To date, the use of ceramic chip carriers on glass-fiber reinforced wiring boards has been limited to small units where the success has been marginal because of the solder joint fatigue resulting from the differential thermal expansion coefficients between the ceramic chip carrier and the fiber reinforced plastic printed wiring board. The best success in using leadless ceramic chip carriers heretofore has been in installations where the ceramic chip carrier is secured to a ceramic printed wiring board. See "High-density chip carriers compete with DIPS," Electronic Products Magazine, November 1980, pgs. 27-32.

In order to use large ceramic chip carriers and to employ multiple ceramic chip carriers on a common printed wiring board, there is a need to produce a printed wiring board having an apparent coefficient of thermal expansion approximating that of the ceramic chip carrier yet retaining the coefficient of thermal expansion approximating that of the solder, plating and component leads in the thickness direction of the printed wiring board.

DESCRIPTION OF THE INVENTION

According to the present invention, a printed wiring board substrate is prepared by securing a conventional printed wiring board (such as glass fiber reinforced epoxy printed wiring board) to a fiber reinforced plastic support having a thermal coefficient of expansion which closely approaches zero, i.e., is less than 2 microinch/inch/°F. By securing the conventional printed wiring board to such support member through an appropriate adhesive, the printed wiring board will have an apparent coefficient of thermal expansion in its surface approximating that of the ceramic chip carrier yet will retain its normal coefficient of thermal expansion in its thickness direction. The support member is fabricated from graphite filament reinforced thermoset resins such as graphite filament reinforced epoxy resins. Such graphite filament reinforced epoxy laminates exhibit extremely low thermal coefficient of expansion, for example, 0 to 1.6 microinch/inch/°F. By securing the support member having the coefficient of 0 to 1.6 to the fiber reinforced plastic printed wiring board having an unrestrained thermal expansion coefficient of about 7.5, the resulting composite laminate will exhibit at its exposed surface an apparent coefficient of thermal expansion in the range of about 3.5 to 4—which approximates the thermal expansion coefficient of the ceramic chip carrier. As a consequence, when a ceramic chip carrier is connected to the printed wiring board composite laminate, the resulting soldered joints do not experience significant stresses when exposed to thermal variations. The soldered joints connecting the elements of the ceramic chip carrier to the electrical elements of the printed wiring board have increased reliability.

While graphite filaments are prepared, other low expansion reinforcing fibers may be employed, e.g., Kevlar fibers which are aramid fibers sold by E. I. du Pont de Nemours and Company.

A preferred adhesive is a pre-preg which is a mat or fabric of glass fibers impregnated with polymerizable thermosetting resin such as epoxy resin.

DESCRIPTION OF THE PREFERRED EMBODIMENT(S)

Figure 1:
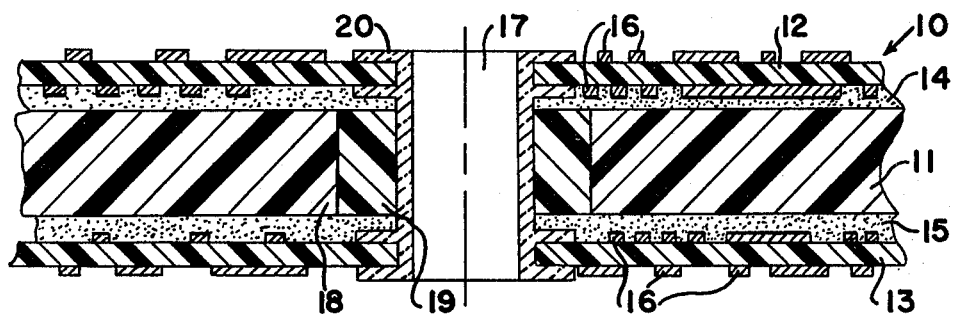
FIG. 1 is a fragmentary cross-section view of a preferred embodiment of the present composite printed wiring board.

Referring to FIG. 1 there is illustrated a substrate 10 formed from a support member 11, two printed wiring boards 12, 13 secured to the support member 11 by means of adhesive 14, 15, respectively. Each of the printed wiring boards 12, 13 is provided with electrical conducting strips 16.

The support member 11 is fabricated from graphite filament reinforced thermosetting resin, preferably epoxy resin although other resins such as polyimides, unsaturated polyester resins, triazine epoxy resins and others may be employed. The printed wiring boards preferably are glass fiber reinforced laminates of thermosetting resins such as epoxy resins although unsaturated polyester resins, polyimides, and other resins may be employed. The fibrous reinforcement usually is glass fibers although other fibers have been used, such as aramid and asbestos fibers. Because the graphite-reinforced support member 11 is electrically conductive, it is necessary to insulate the support member 11 from a plated-through hole 17. This is accomplished by drilling an oversized bore 18 in the support member 11 and filling the perimeter of the bore 18 with electrically non-conductive filler 19 such as an epoxy washer or any other suitable insulating substances having a low coefficient of thermal expansion. Other low expansion reinforcements such as aramid fibers do not require a non-conductive filler 19. The plated-through hole 17 has a copper lining 20 which provides electrical connection between common electrical conducting strips 16 on both surfaces of the printed wiring board 12 and both surfaces of the printed wiring board 13. Such constructions are illustrated in U.S. Pat. No. 3,700,538.

It will be observed that the printed wiring boards 12, 13 are less restrained in the direction of their thickness and thus can approximate the normal coefficient of thermal expansion in that direction. However, the printed wiring boards 12, 13 are mechanically secured through the adhesive 14, 15, respectively, to the support member 11 whereby the composite structure 10 exhibits an apparent coefficient of thermal expansion over the surfaces of the printed wiring boards 12, 13 which is less than the normal thermal coefficient of expansion of those boards 12, 13 and approximates the thermal coefficient of expansion of a ceramic chip carrier.

Figure 2:
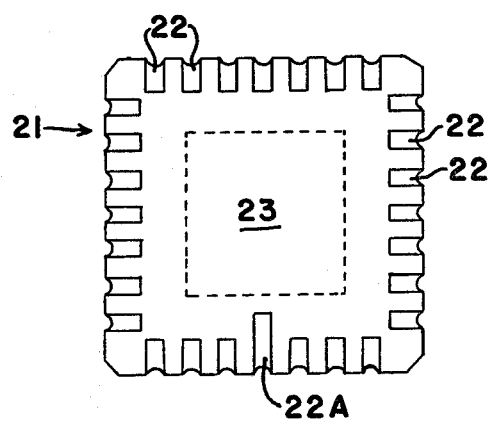
FIG. 2 is a bottom view of a typical 28 I/O ceramic chip carrier.

In FIG. 2, a typical 28 I/O ceramic chip carrier 21 is fabricated from a ceramic substance such as alumina and has a thermal coefficient of expansion in the range of 3.5 to 4 microinch/inch/°F. The ceramic chip carrier 21 has a plurality of I/O conductive pads 22 which are arranged to provide electrical connections to an integrated circuit chip which is mounted in a sealed pocket 23 for rigidity and protection within the carrier 21. At least one of the conductive pads 22A is visually different from the remaining conductive pads 22 to serve as an indexing pad for subsequent connection of the ceramic chip carrier to the corresponding array of conductive pads supplied in an appropriate printed wiring board.

The 28 pin I/O ceramic chip carrier 21 typically has the appearance of a postage stamp with dimensions up to about ½-inch by ½-inch and a thickness of about 1/10 inch or less. The conductive pads 22 are usually provided on 40 or 50 mil centers. A larger standard ceramic chip carrier, containing 84 pin I/O conductive pads, is about 1¼ inch by 1¼-inch. Even larger ceramic chip carriers are planned.

In order to utilize the integrated circuit chips which are carried by ceramic chip carriers, it is necessary to provide a reliable electrical connection between each of the conductive pads 22 and a corresponding electrical conductive pad in an appropriate printing wiring board.

Figure 3:
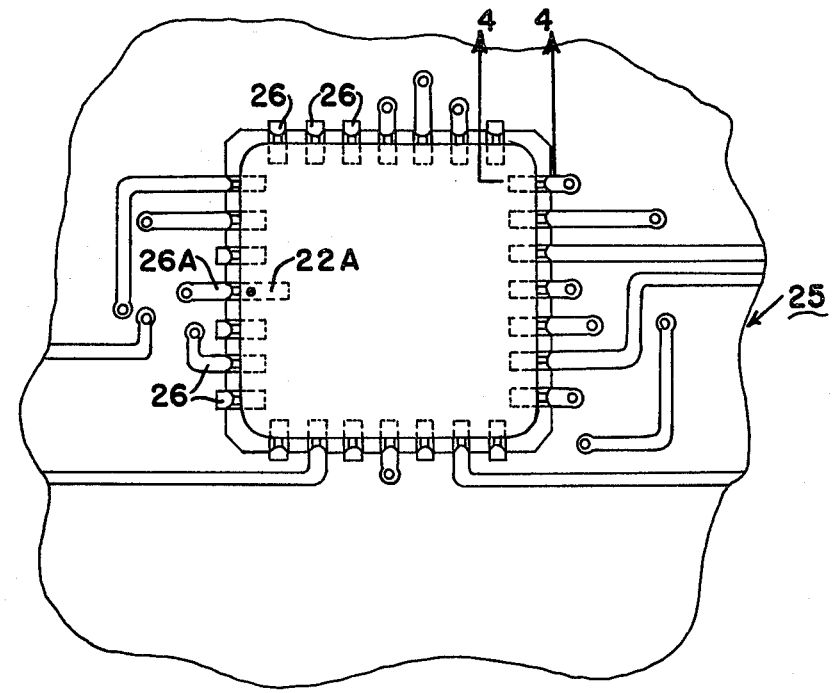
FIG. 3 is a plan view of a surface of the composite printed wiring board of this invention with a ceramic chip carrier secured to the surface.

Referring to FIG. 3 a typical printed wiring board 25 is provided with a pattern of conductive pads 26 over its surface. At least one of the conductive pads 26A is visually different from the remaining conductive pads 26 to provide a visual index and size for the corresponding index pad 22A of a ceramic chip carrier 21.

Figure 4:
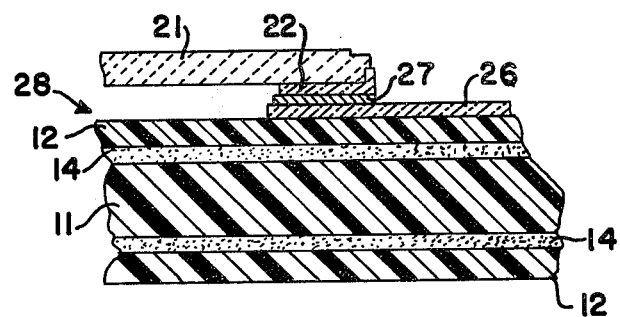
FIG. 4 is a fragmentary cross-section view taken along the line 4—4 of FIG. 3 showing a solder connection between a ceramic chip carrier and an electrical conductor of a printed wiring board of this invention.

The ceramic chip carrier 21 is positioned with its conductive pads 22 aligned with the conductive pads 26 of the printed wiring board 25. The conductive pads are secured together by electrically conductive solder 27 as shown in FIG. 4. The composite printed wiring board 28 of FIG. 4 includes only a single printed wiring board 12 secured by means of adhesive 14 to a support member 11.

The technique for securing the ceramic chip carrier 21 to the printed wiring board composite 28 is well known. The solder 27 preferably is applied by vapor phase soldering techniques. In a specific example, the conductive pads 26 are individually covered with an approximate 6 mil layer of solder paste applied by silk screen technique to the printed wiring board 12. The conductive pads 22 of the ceramic chip carrier 21 are prepared by coating with a suitable solder flux and the ceramic chip carrier is then dipped on molten solder, for example at about 500° F. for 5 seconds to provide a film of solder over each of the conductive pads 22. Thereafter the ceramic chip carrier is aligned on the printed wiring board 12 with the conductive pads 22 above the conductive pads 26 which are already coated with the solder paste. A light pressure is applied to the ceramic chip carrier in order to set the carrier in the solder paste. The assembly of ceramic chip carrier and printed wiring board composite 28 is placed in a heated vapor zone at a sufficient temperature and for sufficient time to melt the solder. In a typical example, about 45 seconds exposure to vapors of a fluid which has a boiling temperature of 419° F. has been satisfactory for solder which has a melting point of 360° F.

After the solder has been fused and the pads 22 are connected by the solder 27 to the pads 26, the structure is cleaned in a suitable solvent such as trichlorethane to remove the surplus solder flux. Thereafter the solder joints are visually inspected with a 50X magnifying glass to detect any irregularities.

Results

Two duplicate structures prepared exactly as described in the preceding description were fabricated from a composite printed wiring board having two glass fiber epoxy printed wiring boards, each 17 mils thick, and graphite filament epoxy support, about 24 mils thick. The two glass fiber reinforced epoxy printed wiring boards were adhered to the graphite filament reinforced epoxy core by means of a prepreg sheet of glass fiber mat impregnated with epoxy resin. The sandwich, consisting of the two outer glass-fiber reinforced printed wiring boards, the graphite filament reinforced epoxy core and the intermediate epoxy-glass fiber prepregs, is compressed and heated to cure the adhesive. The structures were exposed to a temperature cycling test wherein the units were maintained at minus-55° C. for 10 minutes, thereafter at ambient temperature for 5 minutes, thereafter at 125° C. for 10 minutes, thereafter at ambient temperature for 5 minutes through 300 such cycles. The structures were inspected and the electrical resistance through the soldered connections was measured and recorded every 12 hours.

The two specimens showed no joint failures after 300 thermal cycles. A comparison structure having the same ceramic chip carrier secured by the same soldering process to the same unsupported glass fiber epoxy printed wiring board failed after 96 cycles and before 120 cycles—that is—solder joint failures were observed as evidenced by a significant increase in the resistance measurements.

Glass fiber reinforced printed wiring boards have a surface coefficient of thermal expansion of 7.5 microinch/inch/°F. when unrestrained and a thickness coefficient of thermal expansion of 42 microinch/inch/°F. The same printed wiring board, when restrained in the laminate of this invention, exhibited a surface coefficient of thermal expansion of 4.1 microinch/inch/°F. and a thickness coefficient of thermal expansion of 31 microinch/inch/°F.

I claim:

1. A composite printed wiring board laminate comprising:
    a support fabricated from graphite filament or aramid filament reinforced thermoset resin and having a coefficient of thermal expansion less than 2 microinch/inch/°F.;
    a wiring board fabricated from fiber reinforced thermoset resin and having electrically-conductive strips applied to at least one surface thereof, said wiring board having a thermal coefficient of expansion substantially greater than 2 microinch/inch/°F.;
    said wiring board being secured to said support by means of a thermoset adhesive, whereby the apparent coefficient of thermal expansion of the said wiring board over its surface in the composite assembly approaches that of the said support member.

2. The composite laminate of claim 1 including two said wiring boards, each secured to the said support by means of a thermoset adhesive and each including electrical conductive strips, wherein said printed wiring boards are electrically connected together and are electrically insulated from said support means.

3. A composite wiring board laminate having a ceramic chip carrier secured thereto by means of soldered connections between electrically conducting pads of said ceramic chip carrier and corresponding electrically conductive pads of the said printed wiring board, wherein the apparent coefficient of thermal expansion of the said printed wiring board over its surface approximate that of the said ceramic chip carrier.

* * * * *